(12) United States Patent
Chen et al.

(10) Patent No.: US 10,292,493 B2
(45) Date of Patent: May 21, 2019

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd, Kaohsiung (TW)

( * ) Notice: Subject to any disclaimer, the term of this patent is extended or adjusted under 35 U.S.C. 154(b) by 0 days.

(21) Appl. No.: 15/613,554

(22) Filed: Jun. 5, 2017

(65) Prior Publication Data
US 2018/0098626 A1 Apr. 12, 2018

(30) Foreign Application Priority Data

Oct. 12, 2016 (TW) .............................. 105133131 A

(51) Int. Cl.
| | |
|---|---|
| F16M 13/00 | (2006.01) |
| A47B 88/43 | (2017.01) |
| A47B 88/407 | (2017.01) |
| A47B 57/38 | (2006.01) |
| A47B 96/07 | (2006.01) |
| H05K 7/14 | (2006.01) |

(52) U.S. Cl.
CPC .............. *A47B 88/43* (2017.01); *A47B 57/38* (2013.01); *A47B 88/407* (2017.01); *A47B 96/07* (2013.01); *H05K 7/1489* (2013.01); *A47B 2210/0059* (2013.01)

(58) Field of Classification Search
USPC .............. 248/235; 211/26, 183; 312/334.44, 312/334.46, 334.7, 334.1, 333
See application file for complete search history.

(56) References Cited

U.S. PATENT DOCUMENTS

| | | | |
|---|---|---|---|
| 6,181,549 B1 | 1/2001 | Mills et al. | |
| 8,353,494 B2 * | 1/2013 | Peng | A47B 88/43 211/192 |
| 9,370,120 B2 | 6/2016 | Chen et al. | |
| 9,480,183 B2 | 10/2016 | Chen et al. | |
| 9,526,338 B2 * | 12/2016 | Chen | A47B 47/0058 |
| 9,717,333 B2 * | 8/2017 | Chen | A47B 88/43 |
| 9,801,467 B2 * | 10/2017 | Chen | A47B 88/43 |
| 2008/0067907 A1 * | 3/2008 | Chen | A47B 88/43 312/312 |
| 2008/0078899 A1 * | 4/2008 | Chen | A47B 88/43 248/220.21 |

(Continued)

*Primary Examiner* — Steven M Marsh
(74) *Attorney, Agent, or Firm* — Rosenberg, Klein & Lee

(57) ABSTRACT

A bracket device includes a sidewall, at least one mounting member, an elastic member, and a fastening member is adjacent to the sidewall. The at least one mounting member is connected to the base. The fastening member is movably mounted on the sidewall, includes an engaging structure, can stay in a first state responsive to the elastic force provided by the elastic member, and can be switched from the first state to a second state by operation. The engaging structure of the fastening member is configured to engage with or be mounted to a target member.

20 Claims, 15 Drawing Sheets

(56) References Cited

U.S. PATENT DOCUMENTS

2009/0294393 A1\* 12/2009 Chen .................... H05K 7/1489
                                              211/175
2014/0070064 A1\* 3/2014 Chen .................... A47B 88/044
                                              248/221.11

\* cited by examiner

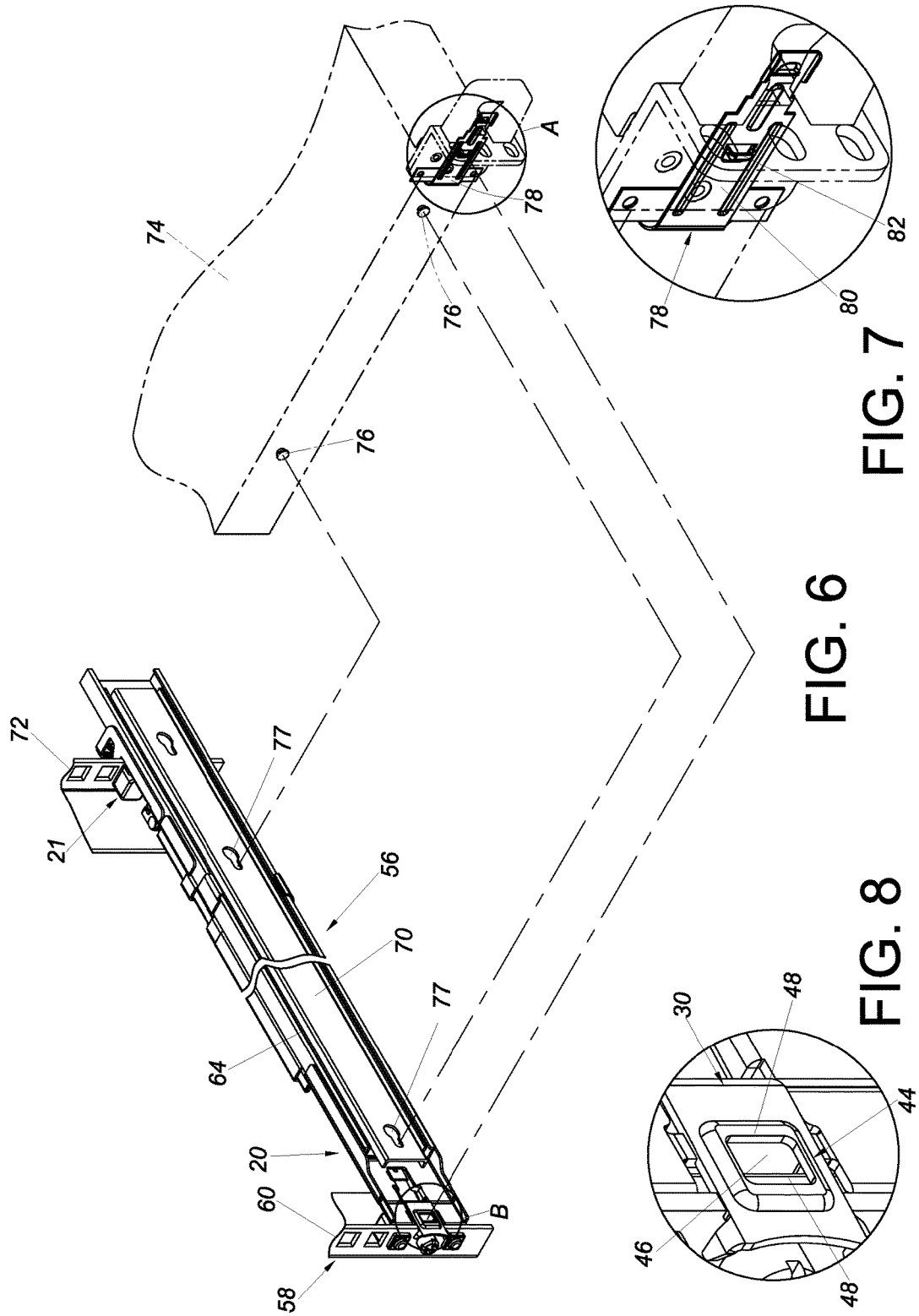

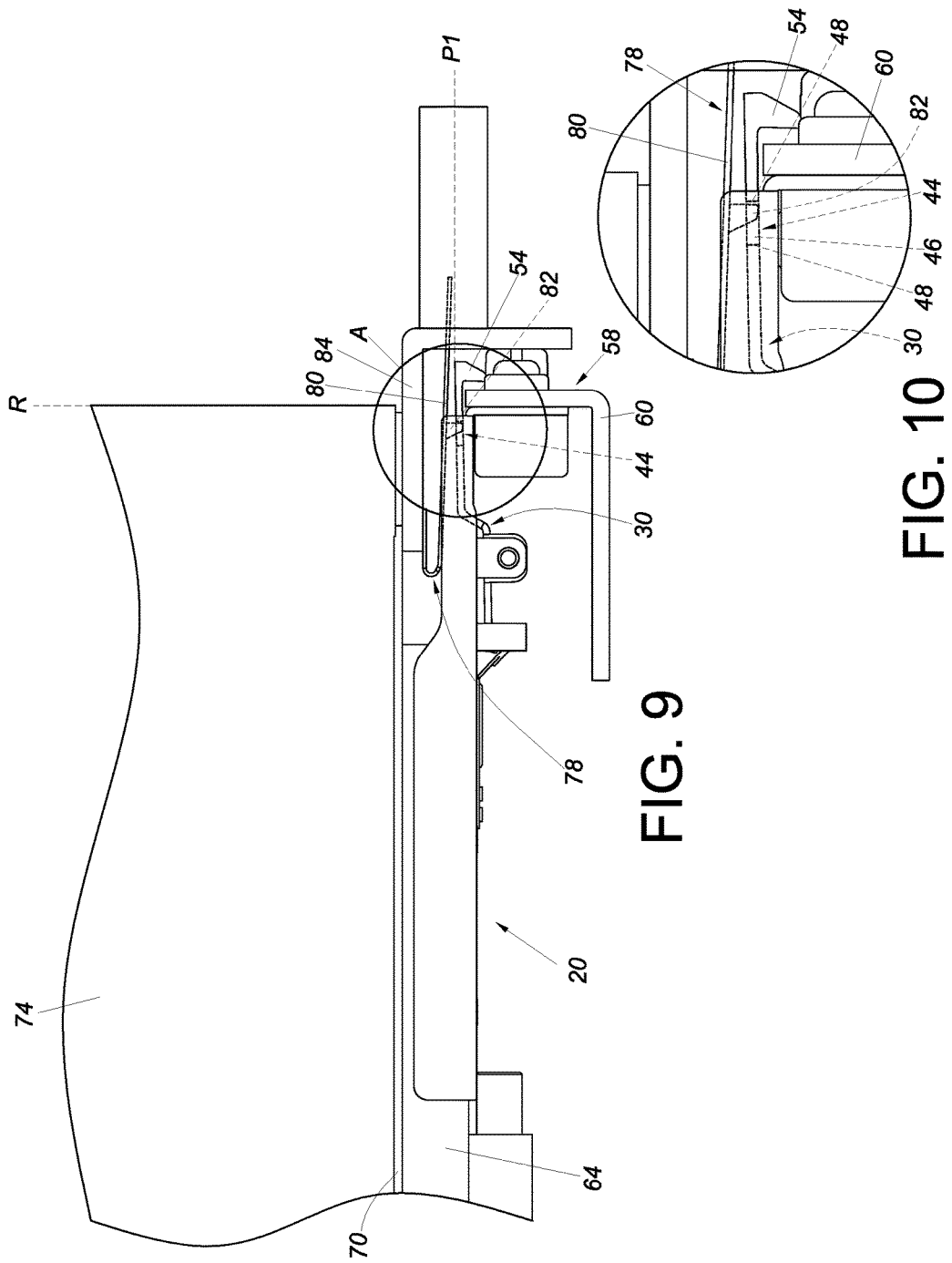

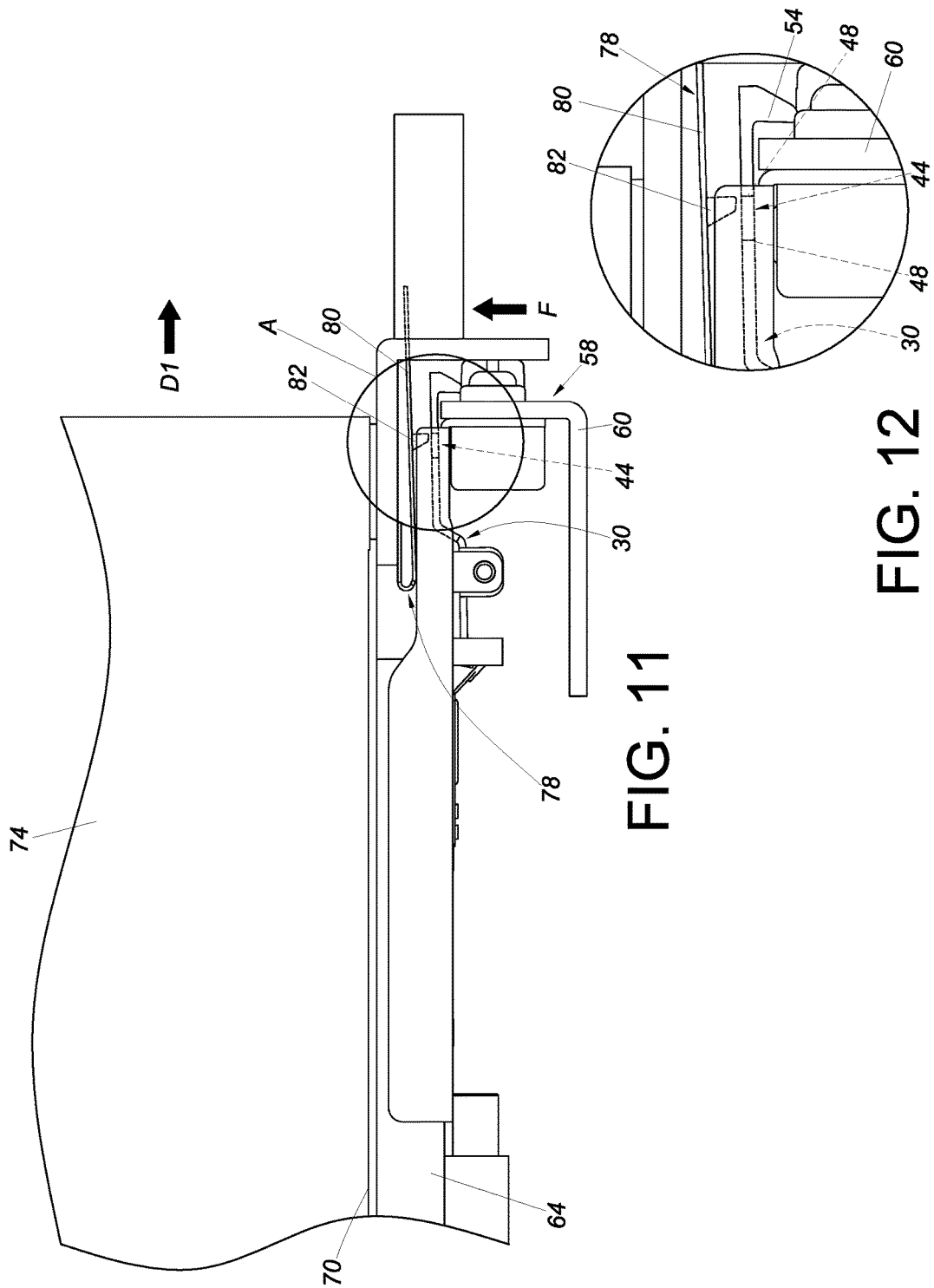

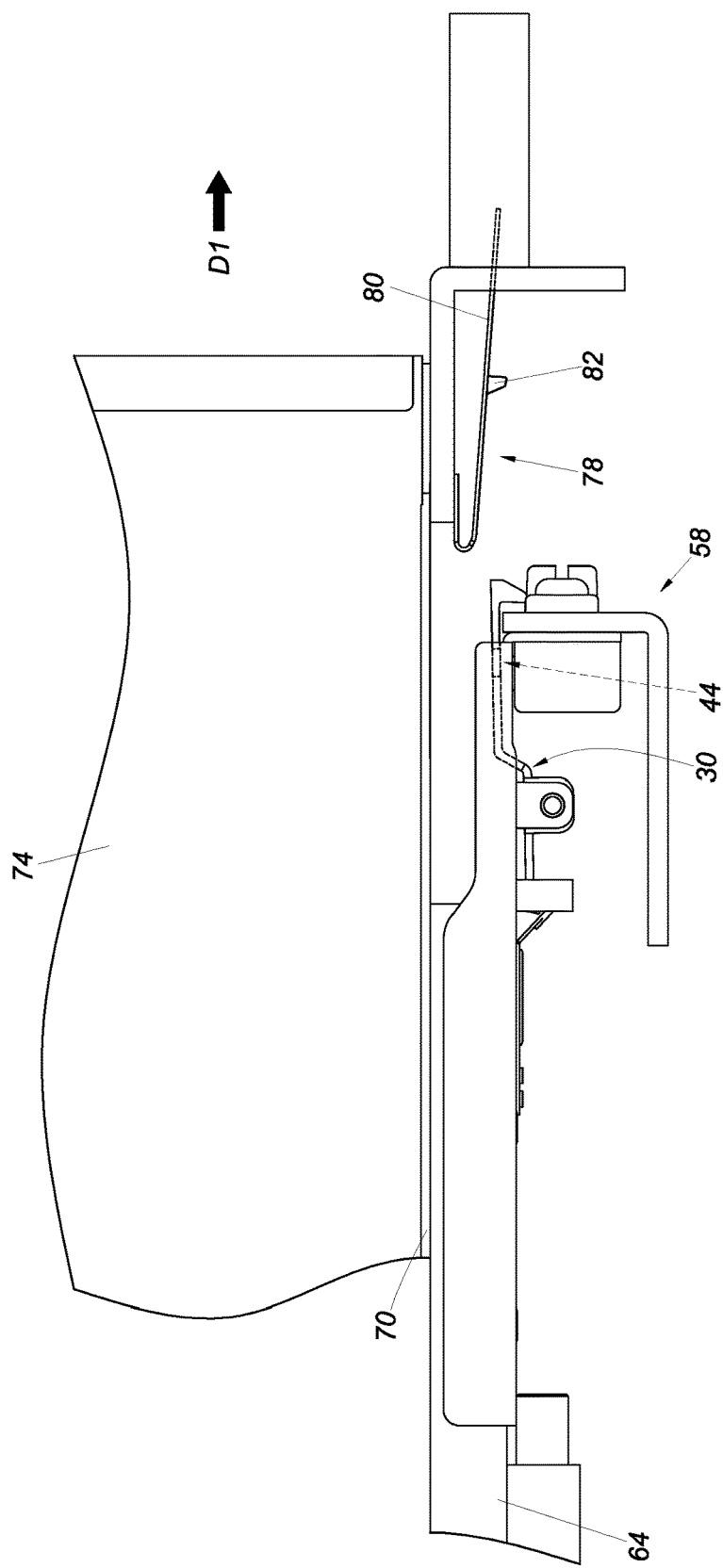

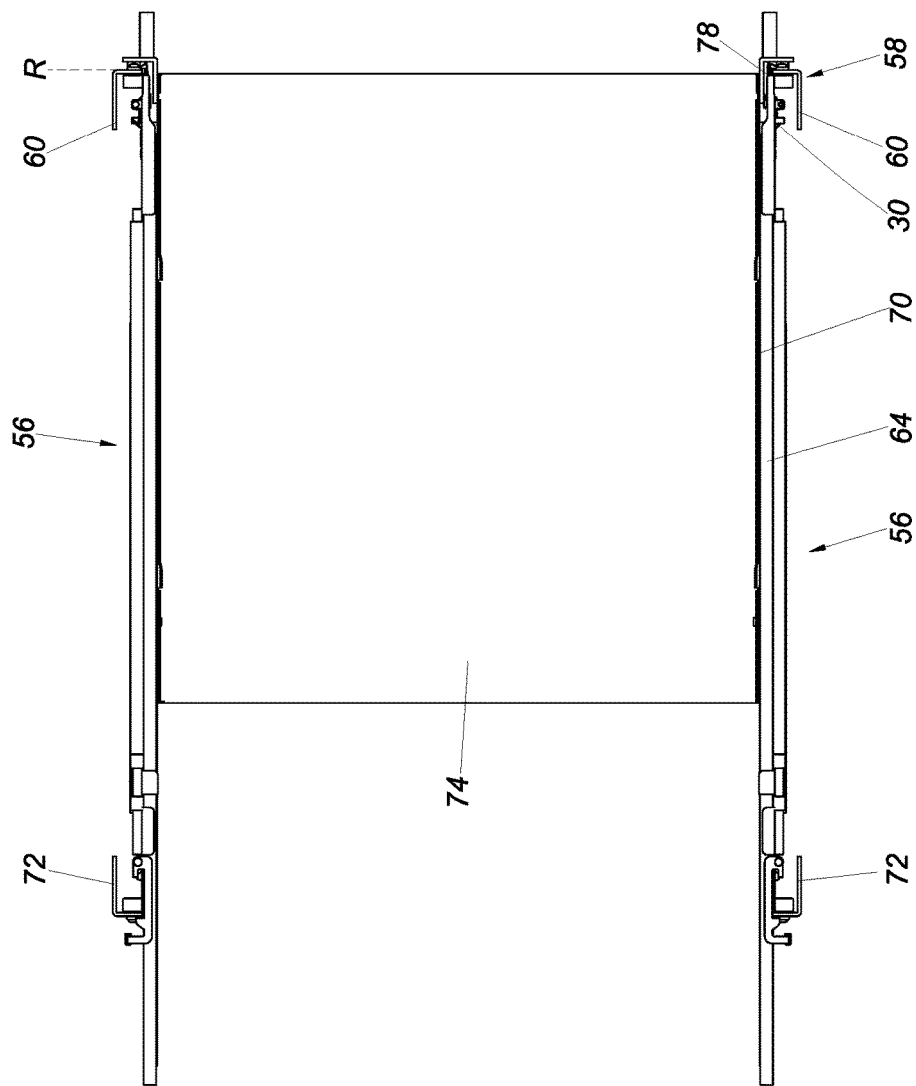

BRACKET DEVICE

FIELD OF THE INVENTION

The present invention relates to a bracket device and more particularly to one configured for mounting a slide rail to a rack.

BACKGROUND OF THE INVENTION

Generally, an object to be supported in a rack-based system is mounted to a rack via a slide rail assembly whose first rail is mounted to a post of the rack, typically by means of a bracket device, and whose second rail is movable with respect to the first rail and is configured for supporting the object.

U.S. Pat. No. 6,181,549 B1, for example, discloses a chassis retaining system for a rack, wherein the system serves mainly to secure a chassis to the rack. More specifically, as shown in FIG. 1 accompanying the specification of the '549 B1 patent, each chassis (105, 110, 115) includes a handle (106, 112, 116), with which a user can move the corresponding chassis (105, 110, 115) out of the rack (101) via the corresponding slide rails (120, 122). The rack (101) includes a vertical member (130) with a plurality of square perforations (133).

Furthermore, the handle (301) in FIG. 3 accompanying the specification of the '549 B1 patent includes a securing device (307), e.g., a snap hook, that extends through one of the square perforations (133) of the vertical member (130) and stays at the back side (313) of the vertical member (130) to secure the chassis to the rack (101). The disclosure of the '549 B1 patent is incorporated herein by reference.

SUMMARY OF THE INVENTION

The present invention provides a bracket device for use with a target member.

According to one aspect of the present invention, a bracket device includes a sidewall, a base, at least one mounting member, an elastic member, and a fastening member. The base is adjacent to the sidewall. The at least one mounting member is connected to the base. The fastening member is movably mounted on the sidewall, includes an engaging structure, and can stay in a first state responsive to the elastic force provided by the elastic member. The engaging structure of the fastening member is configured for engaging with a target member. Preferably, the fastening member can be switched from the first state to a second state by operation Preferably, the engaging structure includes a space and at least one blocking wall adjacent to the space.

Preferably, the bracket device further includes an end wall substantially perpendicularly connected to the sidewall, the base is arranged on the end wall, and the at least one mounting member extends through the end wall.

Preferably, the fastening member is pivotally connected to the sidewall and further includes a lateral portion and a fastening portion bent with respect to the lateral portion, the lateral portion includes the engaging structure, the fastening portion is adjacent to the at least one mounting member when the fastening member is in the first state, and the fastening portion is away from the at least one mounting member when the fastening member is in the second state.

Preferably, the elastic member is arranged between the sidewall and the fastening member.

Preferably, the bracket device further includes a blocking portion bent with respect to the sidewall, and the elastic member includes an elastic portion located between the blocking portion and the fastening member.

Preferably, the fastening member is pivotally connected to the sidewall and includes a lateral portion and a fastening portion bent with respect to the lateral portion, the engaging structure is located at the fastening portion, the engaging structure includes an extension arm and a hook portion bent with respect to the extension arm, and the fastening portion is adjacent to the at least one mounting member when the fastening member is in the first state.

Preferably, the lateral portion and the fastening portion of the fastening member and the extension arm and the hook portion of the engaging structure are integrally formed.

Preferably, the fastening portion has an upper side and a lower side, and the extension arm of the engaging structure is substantially perpendicularly connected between the upper side and the lower side.

Preferably, the bracket device is adapted to be mounted to a slide rail assembly, wherein the slide rail assembly includes a first rail and a second rail displaceable with respect to the first rail, and the sidewall of the bracket is mountable to the first rail.

Preferably, the bracket device is adapted for mounting the slide rail assembly to a rack. The rack includes a post with a plurality of post holes. The first rail of the slide rail assembly is mountable to the post via the bracket device, and the second rail of the slide rail assembly is mountable with an object. The at least one mounting member of the bracket device is configured to extend through one of the post holes of the post. When the fastening member stays in the first state responsive to the elastic force provided by the elastic member, the fastening portion thereof can be locked to the post. The object includes an engaging member. When the second rail is at a retracted position with respect to the first rail, the engaging member of the object can engage with the engaging structure of the fastening member.

BRIEF DESCRIPTION OF THE DRAWINGS

FIG. 6 shows how the first rail of the slide rail assembly is mounted to the post of the rack via the bracket device in the first embodiment of the present invention, and how an object is mounted to the second rail of the slide ail assembly;

FIG. 7 is an enlarged view of the area A in FIG. 6;

FIG. 8 is an enlarged view of the area B in FIG. 6;

FIG. 9 shows how the engaging structure of the bracket device in the first embodiment of the present invention engages with an engaging member of the object;

FIG. 10 is an enlarged view of the area A in FIG. 9;

FIG. 11 shows how the engaging member of the object in FIG. 9 is disengaged from the engaging structure of the bracket device;

FIG. 12 is an enlarged view of the area A in FIG. 11;

FIG. 13 shows how the object in FIG. 11 is displaced in a certain direction via the slide rail assembly;

FIG. 14 shows that the second rail of the slide rail assembly in FIG. 6 is in a retracted state with respect to the first rail, that the second rail of an equivalent slide rail assembly is also in the retracted state, and that the object is within the rack;

DETAILED DESCRIPTION OF THE INVENTION

Figure 1:
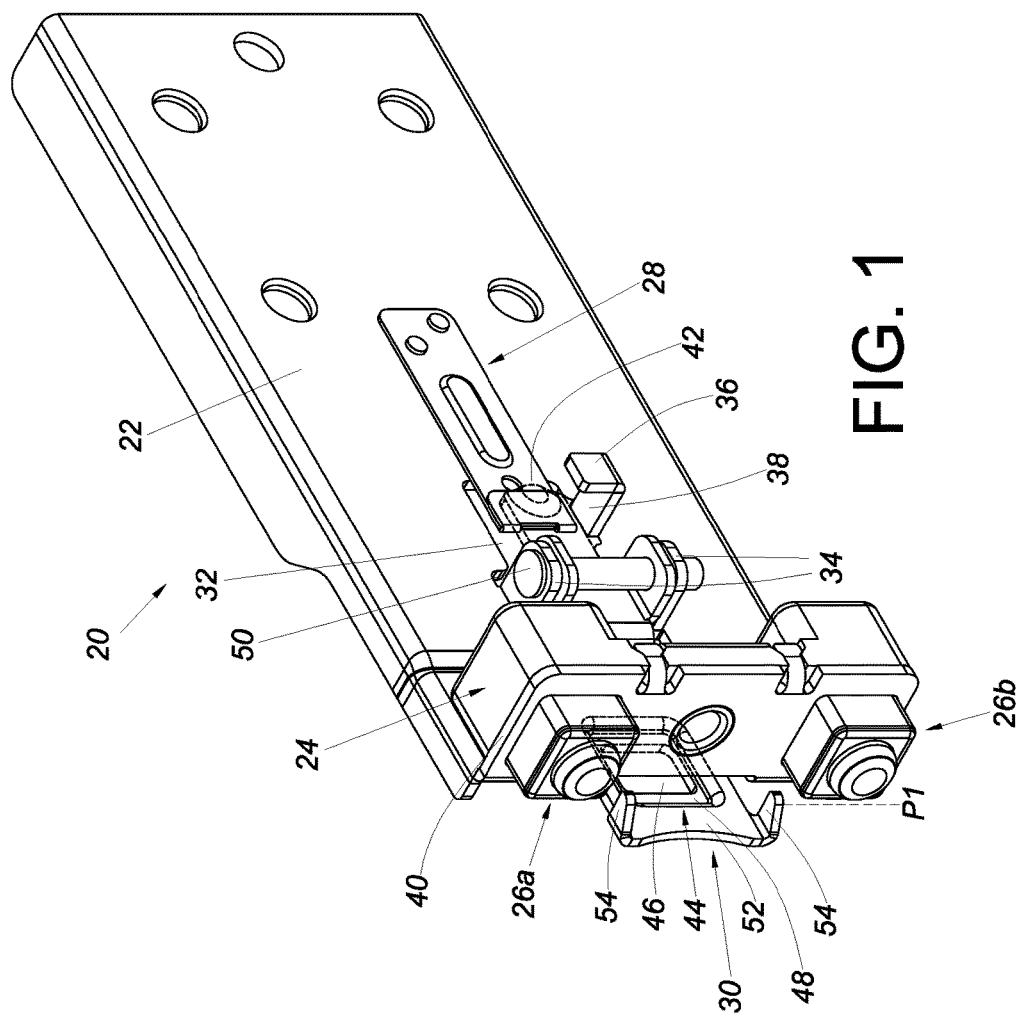
FIG. 1 is an assembled perspective view of the bracket device in the first embodiment of the present invention.
Figure 2:
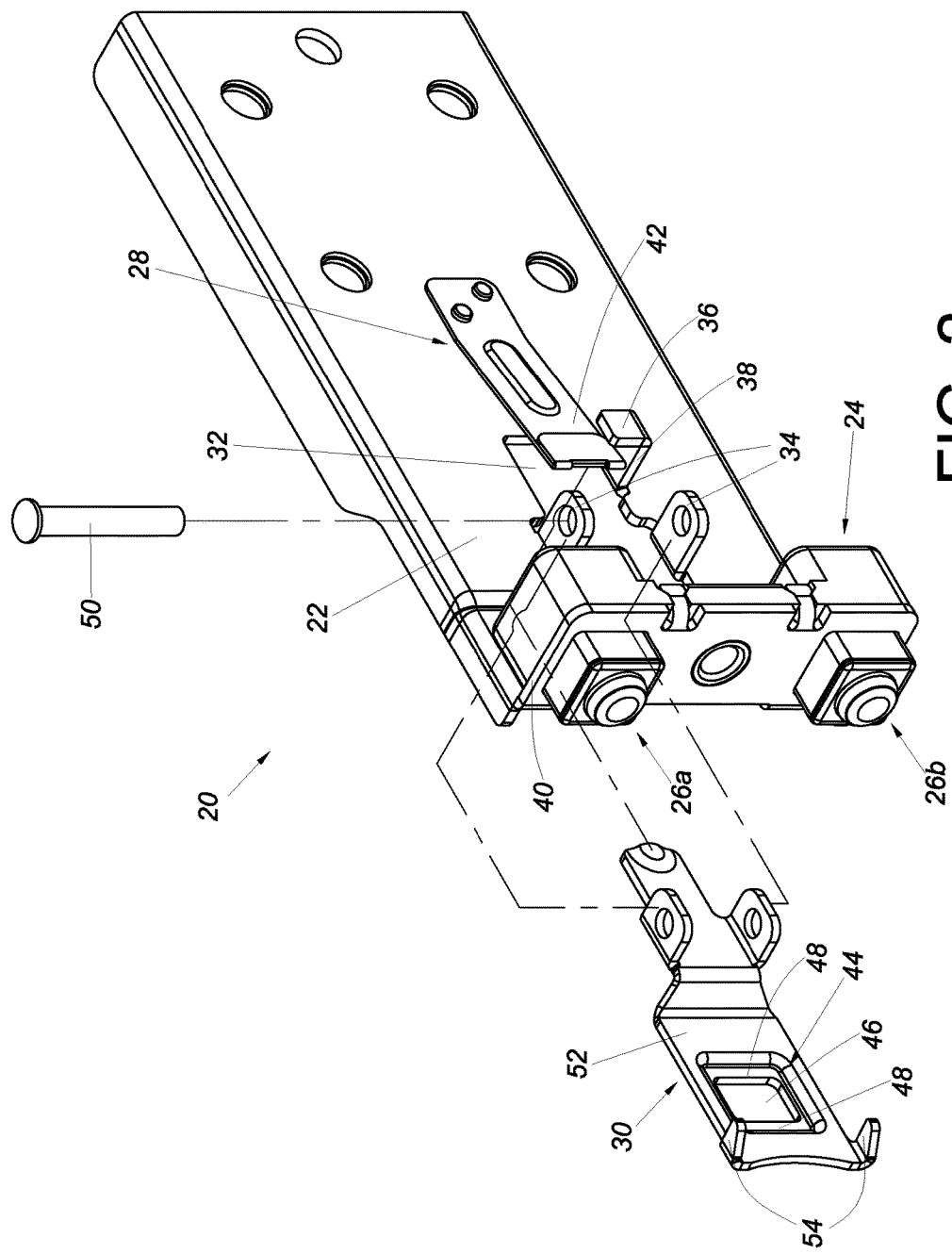
FIG. 2 is an exploded perspective view of the bracket device in the first embodiment of the present invention.

Referring to FIG. 1 and FIG. 2, the bracket device 20 in the first embodiment of the present invention includes a sidewall 22, a base 24, at least one mounting member (e.g., a first mounting member 26a and a second mounting member 26b), an elastic member 28, and a fastening member 30.

The sidewall 22 is substantially longitudinally arranged. In this embodiment, the sidewall 22 includes an opening 32, at least one lug 34, and a blocking portion 36. The at least one lug 34 protrudes transversely with respect to the sidewall 22, and in this embodiment two lugs 34 are provided by way of example. The blocking portion 36 is bent with respect to the sidewall 22. Here, by way of example, the blocking portion 36 is bent with respect to an extension section 38 that protrudes transversely from the sidewall 22, wherein the blocking portion 36 and the extension section 38 may be viewed as part of the sidewall 22. Preferably, the direction in which the extension section 38 protrudes from the sidewall 22 is the direction in which the at least one lug 34 protrudes from the sidewall 22.

The base 24 is adjacent to the sidewall 22. In this embodiment, the bracket device 20 further includes an end wall 40 substantially perpendicularly connected to the sidewall 22. The base 24 is arranged on one side of the end wall 40.

The first mounting member 26a and the second mounting member 26b are connected to the base 24. Here, by way of example, the first mounting member 26a and the second mounting member 26b extend from the aforesaid side of the end wall 40 through the end wall 40 to the opposite side of the end wall 40.

The elastic member 28 is arranged between the sidewall 22 and the fastening member 30. Preferably, the elastic member 28 includes an elastic portion 42 lying between the blocking portion 36 and the fastening member 30.

The fastening member 30 is movably mounted on the sidewall 22 and includes an engaging structure 44. In this embodiment, and by way of example, the engaging structure 44 includes a space 46 and at least one blocking wall 48 adjacent to the space 46. More specifically, the fastening member 30 is pivotally connected to the at least one lug 34 of the sidewall 22 via a shaft 50 by way of example, and the fastening member 30 can be brought into contact with the elastic portion 42 of the elastic member 28 through the opening 32. The fastening member 30 includes a lateral portion 52 and at least one fastening portion 54 (e.g., a pair of fastening portions 54) bent with respect to the lateral portion 52. Preferably, the lateral portion 52 includes the engaging structure 44. The fastening member 30 can stay in a certain state (e.g., a first state P1, or locking state) responsive to the elastic force provided by the elastic member 28. When the fastening member 30 is in the first state P1, the at least one fastening portion 54 is adjacent to the at least one mounting member 26a, 26b.

Figure 3:
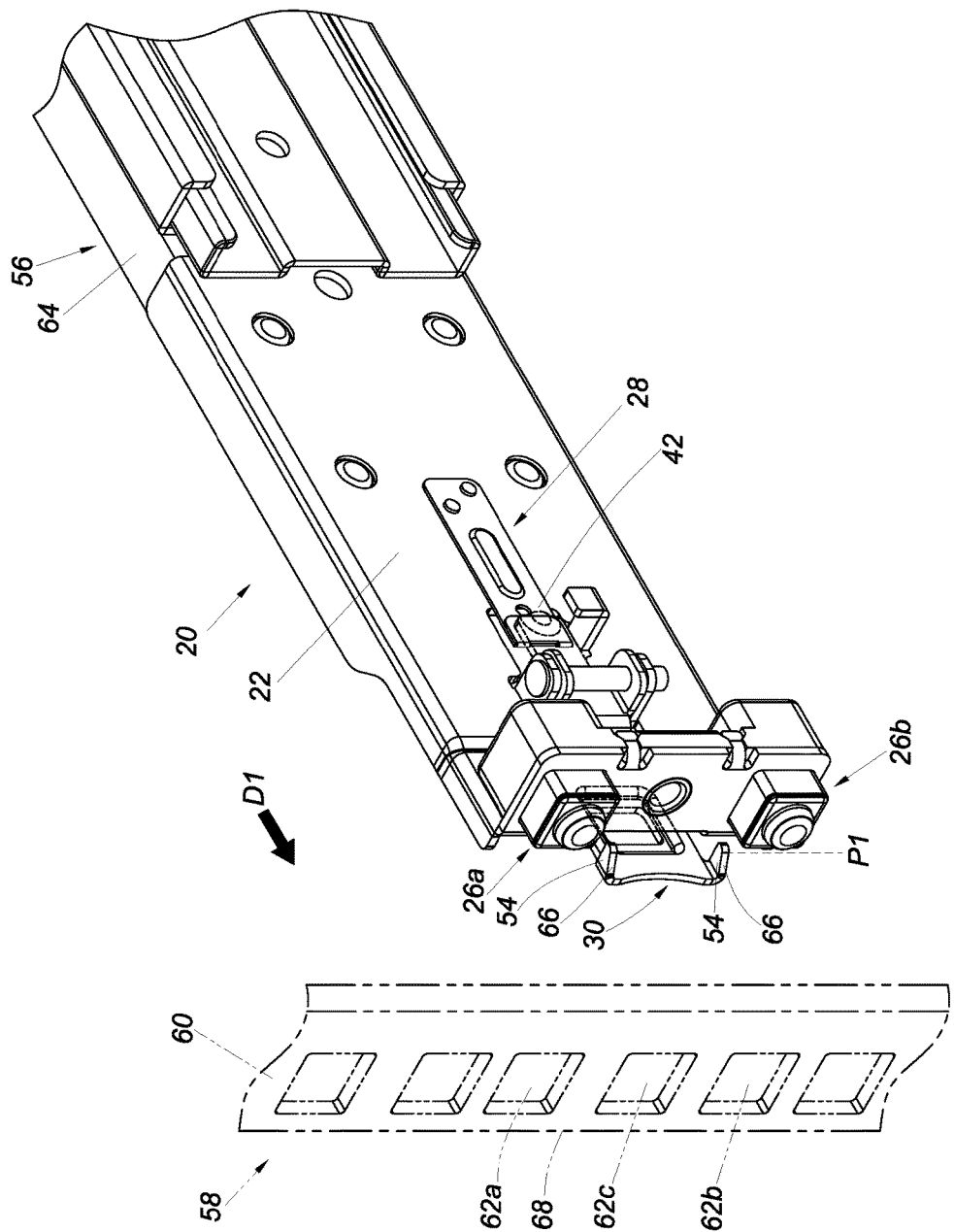
FIG. 3 shows a slide rail assembly mounted with the bracket device in the first embodiment of the present invention and facing a post of a rack in order to be mounted to the post.

As shown in FIG. 3, the bracket device 20 is adapted to be mounted to a slide rail assembly 56 so that the slide rail assembly 56 can be mounted to a post 60 of a rack 58. The post 60 includes a plurality of post holes, such as a first post hole 62a, a second post hole 62b, and a third post hole 62c. The slide rail assembly 56 includes a first rail 64. The sidewall 22 of the bracket device 20 is mounted to the first rail 64. For example, the sidewall 22 of the bracket device 20 is connected to an end portion of the first rail 64 by riveting, threaded connection, or soldering.

Figure 4:
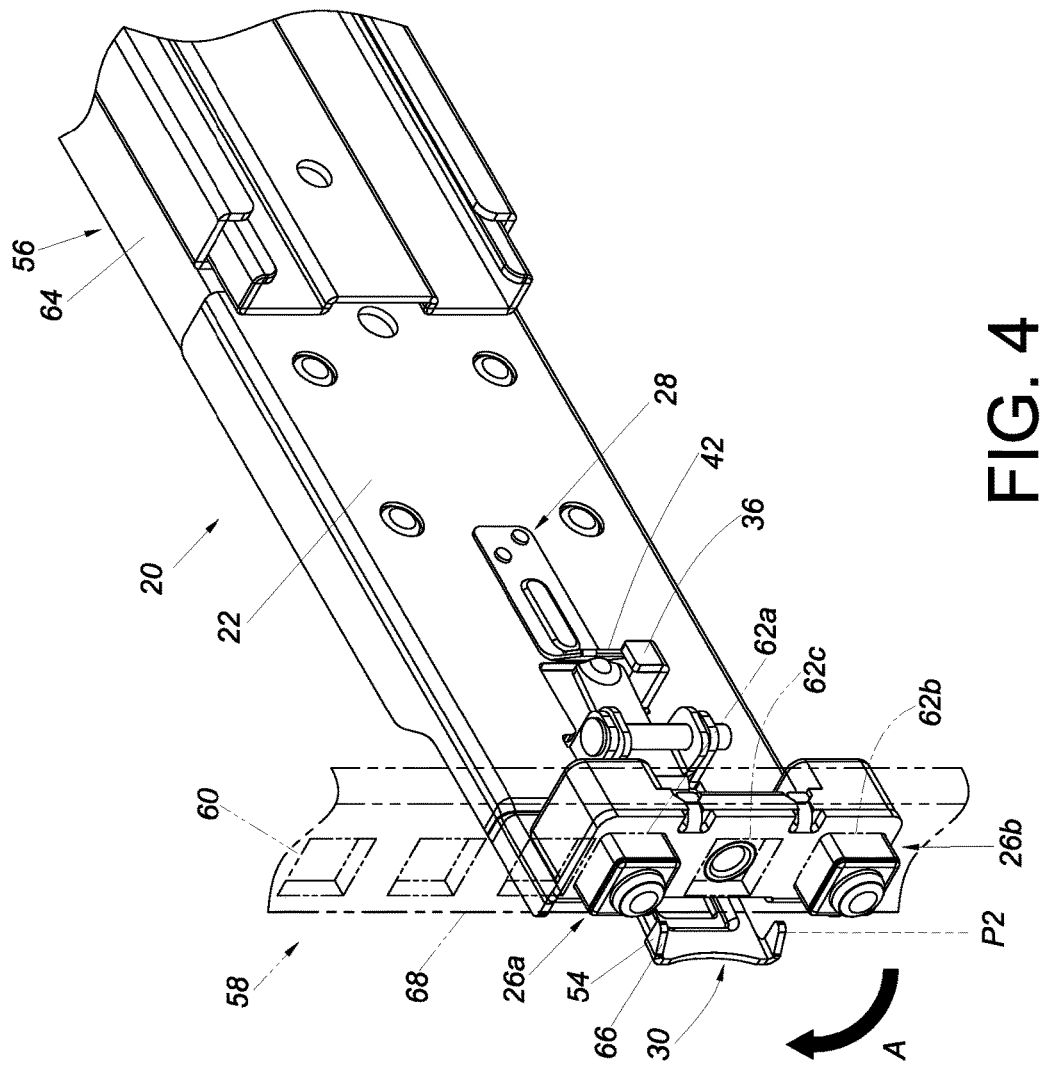
FIG. 4 shows how the fastening member of the bracket device in the first embodiment of the present invention is pivoted to allow insertion of the at least one mounting member into the corresponding at least one post hole of the post.

Referring to FIG. 3 and FIG. 4, when it is desired to mount the slide rail assembly 56 to the post 60 of the rack 58, an operator displaces the slide rail assembly 56 in a first direction D1, aligns the at least one mounting member (e.g., the first mounting member 26a and the second mounting member 26b) of the bracket device 20 with the first post hole 62a and the second post hole 62b of the post 60 respectively, and then inserts the first mounting member 26a and the second mounting member 26b into the first post hole 62a and the second post hole 62b of the post 60 respectively.

During the process, the fastening member 30 is driven out of the first state P1 by the operator's operation. For example, the fastening member 30 is rotated through an angle in a pivoting direction A and is thus switched from the first state P1 to a second state P2 (or unlocking state), moving the at least one fastening portion 54 away from the at least one mounting member 26a, 26b. Preferably, the at least one fastening portion 54 further includes a guide surface 66 such as an inclined or curved surface. In the course in which the slide rail assembly 56 is displaced in the first direction D1, the guide surface 66 of the at least one fastening portion 54 is brought into contact with an edge 68 of the post 60 to facilitate the switching of the fastening member 30 from the first state P1 to the second state P2. As an alternative, the operator may directly apply a force to the fastening member 30 to switch it from the first state P1 to the second state P2. The elastic portion 42 of the elastic member 28 stores an elastic force while the fastening member 30 is in the second state P2. Moreover, the elastic portion 42 of the elastic member 28 can be pressed against the blocking portion 36 in order not to be moved excessively.

Figure 5:
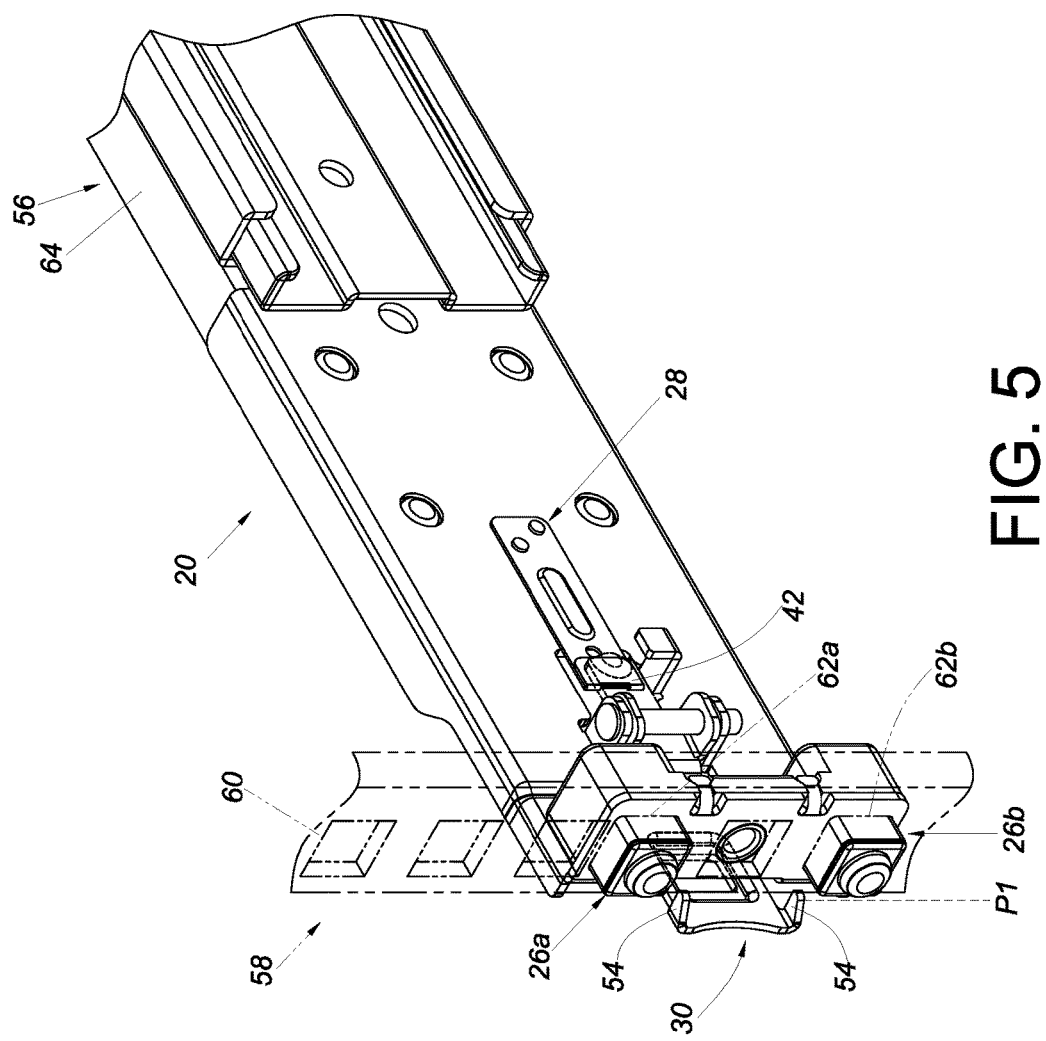
FIG. 5 shows the bracket device in the first embodiment of the present invention mounted on the post of the rack.

Referring to FIG. 4 and FIG. 5, once the first mounting member 26a and the second mounting member 26b are respectively and completely inserted into the first post hole 62a and the second post hole 62b of the post 60, the fastening member 30 returns from the second state P2 to the first state P1 responsive to the elastic force of the elastic portion 42 of the elastic member 28. Thus, with the at least one fastening portion 54 locked to the post 60, the slide rail assembly 56 is mounted on the post 60 of the rack 58.

As shown in FIG. 6, the slide rail assembly 56 further includes a second rail 70 that can be displaced with respect to the first rail 64. The first rail 64 of the slide rail assembly 56 has an end portion configured to be mounted to the post 60 of the rack 58 via the bracket device 20 (e.g., a front bracket device) and an opposite end portion configured to be mounted to another post 72 of the rack 58 via another bracket device 21 (e.g., a rear bracket device).

More specifically, the second rail 70 is configured to be mounted with an object 74. The object 74, which may be a chassis or a piece of electronic equipment, has a lateral side with a plurality of mounting portions 76 corresponding to and to be mounted to a plurality of mounting features 77 (e.g., supporting holes) of the second rail 70 respectively. In this embodiment, the object 74 includes an engaging member 78 (as can be seen more clearly in FIG. 7). The engaging member 78 of the object 74 can be viewed as a target member. The engaging member 78 includes an elastic arm 80 and an engaging feature 82 (e.g., a protruding portion) on the elastic arm 80. The engaging feature 82 corresponds to the space 46 of the engaging structure 44 of the fastening member 30 of the bracket device 20 (as can be seen more clearly in FIG. 8).

Referring to FIG. 9, the elastic arm 80 of the engaging member 78 is arranged on a projecting element 84 of the object 74. The elastic arm 80 in this embodiment has a substantially U-shaped structure. The fastening member 30 of the bracket device 20 is shown in FIG. 9 as in the first state P1, with the at least one fastening portion 54 locked to the post 60.

While the second rail 70 is at a retracted position R with respect to the first rail 64, the object 74 is in the rack 58 (which is represented in FIG. 9 by the post 60 of the rack 58), and the engaging member 78 of the object 74 is engaged with or mounted on the engaging structure 44 of the fastening member 30. More specifically, the engaging feature 82 extends into and stays in the space 46 of the engaging structure 44 of the fastening member 30 due to the elastic force of the elastic arm 80. Furthermore, the engaging feature 82 corresponds to the at least one blocking wall 48 such that the engaging member 78 of the object 74 is engaged with or mounted on the engaging structure 44 of the fastening member 30 (as can be seen more clearly in FIG. 10).

Referring to FIG. 11, when it is desired to pull the object 74 in the first direction D1 from inside the rack 58, the operator applies a force F to the elastic arm 80 of the engaging member 78 in order to disengage the engaging feature 82 from the engaging structure 44 of the fastening member 30 (as can be seen more clearly in FIG. 12).

Once the engaging feature 82 is disengaged from the engaging structure 44 of the fastening member 30, as shown in FIG. 13, the object 74 can be pulled out of the rack 58 by displacing the second rail 70 longitudinally in the first direction D1 with respect to the first rail 64.

Referring to FIG. 14, the two lateral sides of the object 74 are mounted to the rack 58 by a pair of slide rail assemblies 56 respectively, wherein the rack 58 includes two pairs of posts 60 and 72. When the second rails 70 of the slide rail assemblies 56 are at the retracted position R with respect to their respective first rails 64, the engaging members 78 of the object 74 are engaged with the engaging structures 44 of the fastening members 30 respectively. (The engaging process can be understood by referring to FIG. 9 and FIG. 10 and therefore will not be described repeatedly.)

Figure 15:
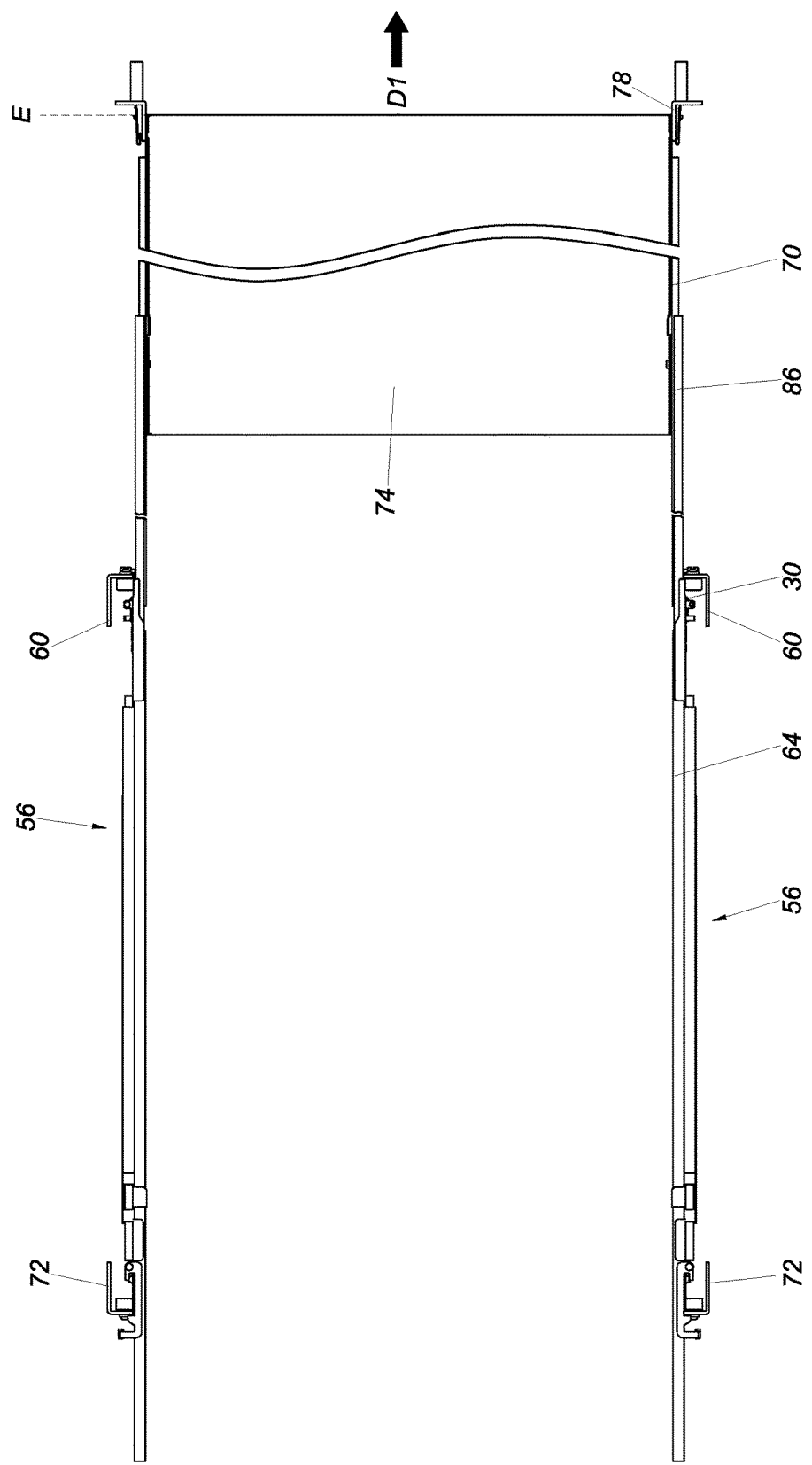
FIG. 15 shows that the second rails of the slide rail assemblies in FIG. 14 are in an extended state with respect to their respective first rail, and that the object is outside the rack.

Referring to FIG. 15, once the engaging members 78 of the object 74 are disengaged from the engaging structures 44 of the fastening members 30 respectively (which process can be understood by referring to FIG. 11 and FIG. 12 and therefore will not be described repeatedly), the second rails 70 of the slide rail assemblies 56 can be displaced in the first direction D1 with respect to the first rails 64 from the retracted position R to an extended position E. Each slide rail assembly 56 preferably further includes a third rail 86 movably mounted between the corresponding first rail 64 and second rail 70 in order to increase the distance for which the corresponding second rail 70 can be displaced with respect to the corresponding first rail 64.

Figure 16:
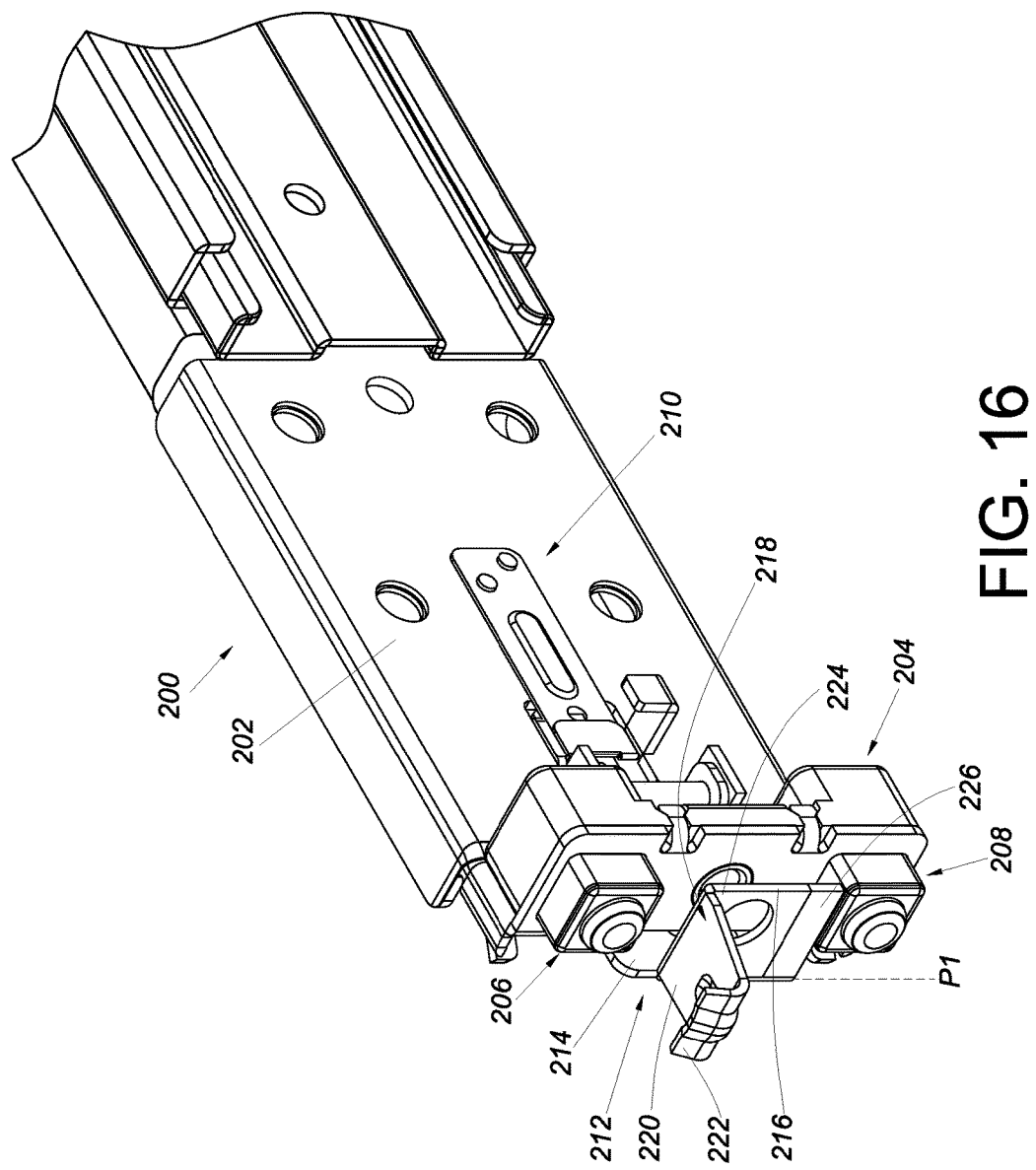
FIG. 16 is a perspective view of the bracket device in the second embodiment of the present invention, wherein the bracket device is mounted on a slide rail.

FIG. 16 shows the bracket device 200 in the second embodiment of the present invention. More specifically, the bracket device 200 includes a sidewall 202, a base 204, at least one mounting member (e.g., a first mounting member 206 and a second mounting member 208), an elastic member 210, and a fastening member 212. The fastening member 212 is pivotally connected to the sidewall 202 and includes a lateral portion 214 and a fastening portion 216 bent with respect to the lateral portion 214. The fastening portion 216 is adjacent to the at least one mounting member 206, 208 while the fastening member 212 is in the first state P1. The bracket device 200 is different from the bracket device 20 in the first embodiment substantially in that the engaging structure 218 of the bracket device 200 is located at the fastening portion 216. More specifically, the engaging structure 218 includes an extension arm 220 and a hook portion 222 bent upward with respect to the extension arm 220. The angle (included angle) between the hook portion 222 and the extension arm 220 may be close to or smaller than 90 degrees; the present invention has no limitation in this regard. Preferably, the lateral portion 214 and the fastening portion 216 of the fastening member 212 and the extension arm 220 and the hook portion 222 of the engaging structure 218 are integrally formed. Preferably, the fastening portion 216 has an upper side 224 and a lower side 226, and the extension arm 220 of the engaging structure 218 is substantially perpendicularly connected between the upper side 224 and the lower side 226. Here, by way of example, the extension arm 220 of the engaging structure 218 is substantially perpendicularly connected adjacent to the upper side 224.

Figure 17:
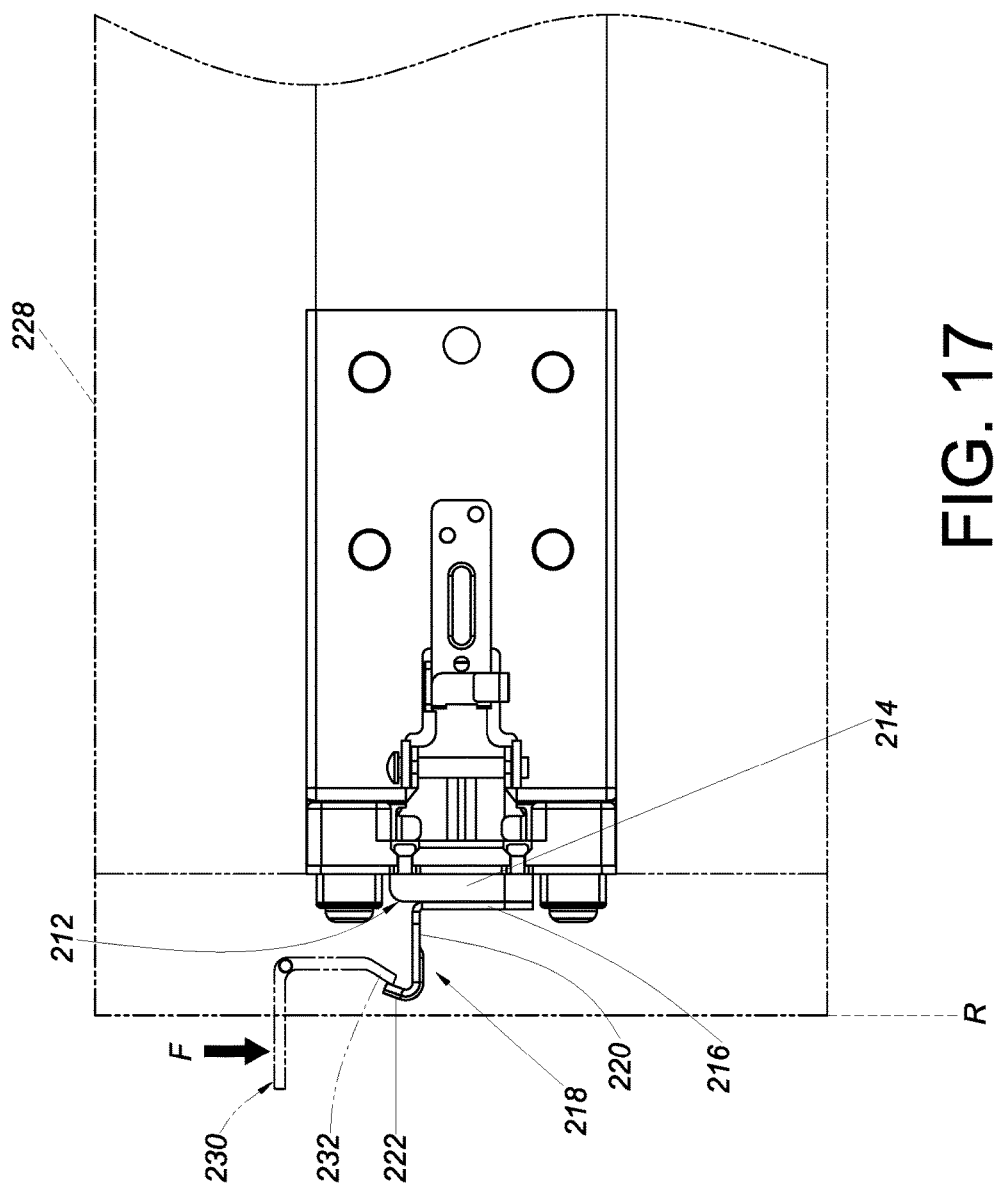
FIG. 17 shows how the engaging structure of the fastening member of the bracket device in the second embodiment of the present invention engages with an engaging member of an object.

Referring to FIG. 17, an object 228 includes an engaging member 230. The engaging member 230 is movably mounted on (e.g., pivotally connected to) the object 228 and includes an engaging portion 232. When the object 228 reaches the retracted position R by means of a second rail displaced with respect to a first rail (the first and second rails can be understood by referring to the description of the first embodiment and therefore will not be described repeatedly), the engaging structure 218 is engaged with the engaging member 230 of the object 228. More specifically, the engaging portion 232 of the engaging member 230 is configured to engage with the hook portion 222, thereby keeping the second rail at the retracted position R with respect to the first rail, or in other words, keeping the object 228 within a rack. The bracket device 200 is therefore capable of locking the object 228 at the retracted position R.

Figure 18:
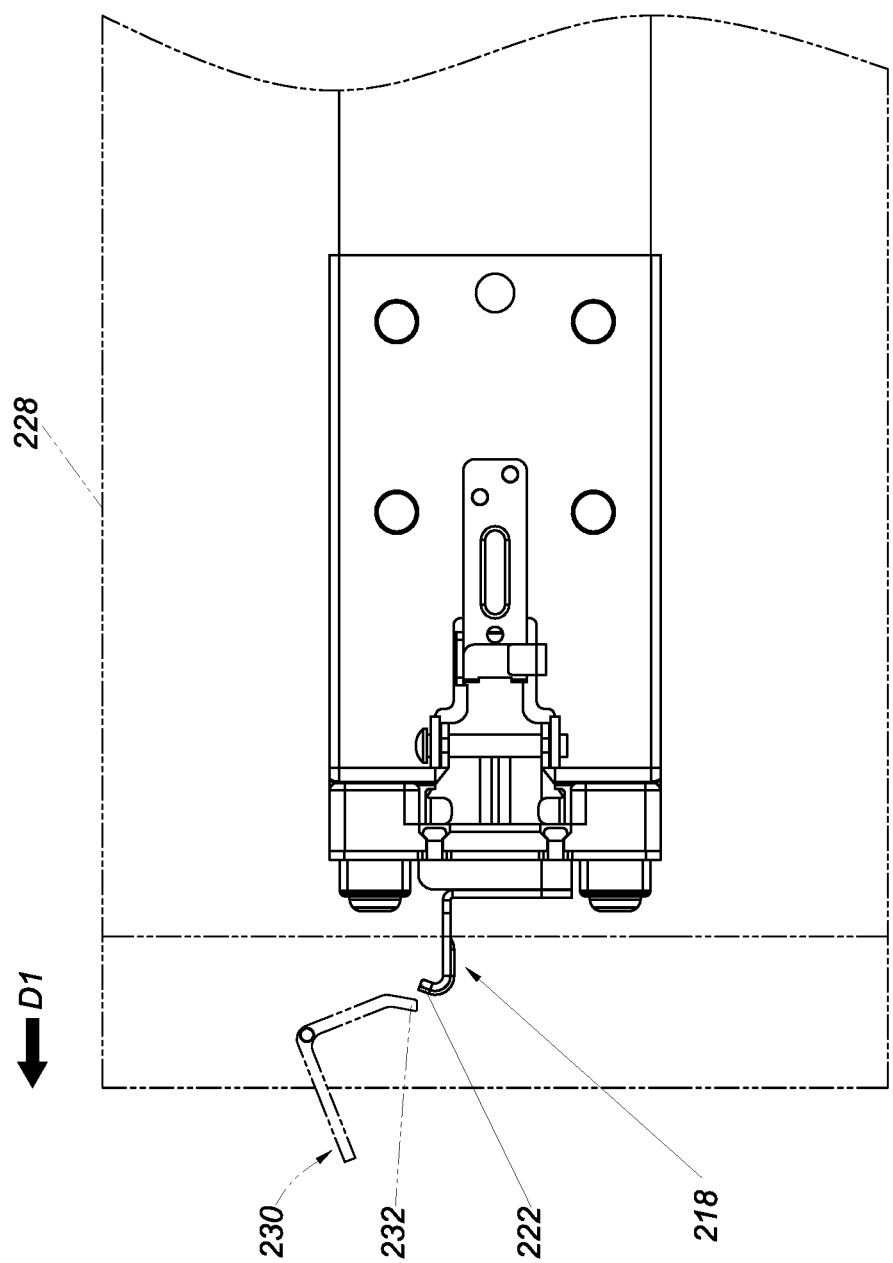
FIG. 18 shows how the engaging member of the object in FIG. 17 is disengaged from the engaging structure of the fastening member of the bracket device.

Referring to FIG. 17 and FIG. 18, the engaging member 230 of the object 228 is rotated by applying a force F thereto; as a result, the engaging portion 232 of the engaging member 230 is disengaged from the hook portion 222 of the engaging structure 218, allowing the object 228 to be pulled out of the rack, i.e., from the retracted position R outward in the first direction D1.

Figure 19:
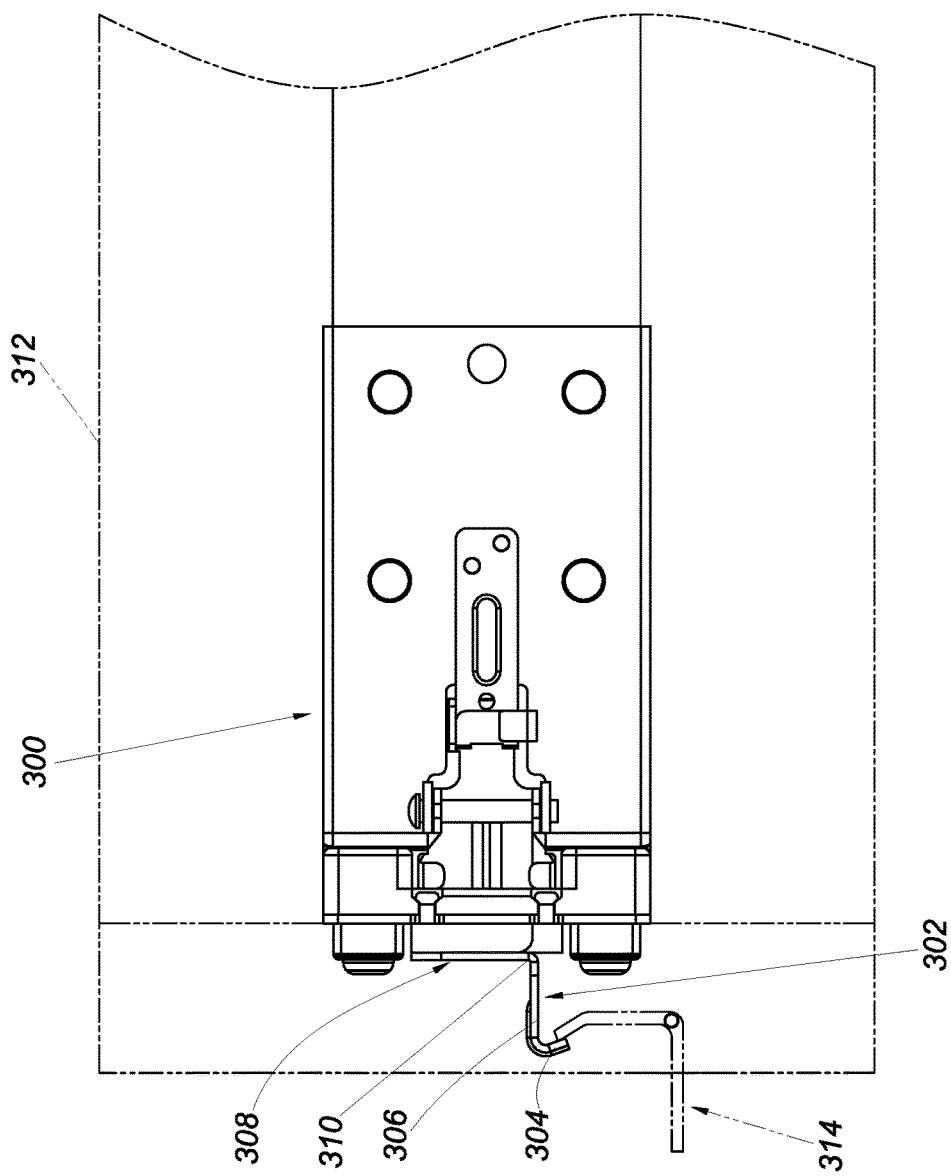
FIG. 19 shows how the engaging structure of the fastening member of the bracket device in the third embodiment of the present invention engages with an engaging member of an object.

FIG. 19 shows the bracket device 300 in the third embodiment of the present invention. The bracket device 300 is different from the bracket device 200 in the second embodiment substantially in that the hook portion 304 of the engaging structure 302 is bent downward with respect to the extension arm 306, and that the extension arm 306 of the engaging structure 302 is substantially perpendicularly connected adjacent to the lower side 310 of the fastening portion 308 by way of example. This arrangement is intended to satisfy the need for the engaging member 314 of the object 312 to engage with a bracket device in a different direction, e.g., to engage with the fastening portion 308 from below.

According to the above, the bracket devices disclosed herein include engaging structures of different forms to enable engagement with target members of different configurations (e.g., the engaging members of different objects).

While the present invention has been disclosed by way of the foregoing preferred embodiments, it is understood that the embodiments described above are not intended to be restrictive of the scope of the invention. The scope of patent protection sought by the applicant is defined by the appended claims.

What is claimed is:

1. A bracket device, comprising:
a sidewall;
a base adjacent to the sidewall;
at least one mounting member connected to the base;
an elastic member; and
a fastening member movably mounted on the sidewall and extending longitudinally beyond the base therefrom, wherein the fastening member includes an engaging structure, and the fastening member is configured to stay in a first state responsive to an elastic force provided by the elastic member;
wherein the fastening member is switchable from the first state to a second state by deflection of the elastic member;
wherein the engaging structure of the fastening member is configured for retentively engaging a target member projecting thereto from an object external to the bracket device.

2. The bracket device of claim 1, wherein the engaging structure includes a space and at least one blocking wall adjacent to the space.

3. The bracket device of claim 2, further comprising an end wall substantially perpendicularly connected to the sidewall, wherein the base is arranged on the end wall, and the at least one mounting member extends through the end wall.

4. The bracket device of claim 1, wherein the fastening member is pivotally connected to the sidewall, the fastening member includes a lateral portion and a fastening portion bent with respect to the lateral portion, the lateral portion includes the engaging structure, the fastening portion is adjacent to the at least one mounting member when the fastening member is in the first state, and the fastening portion is away from the at least one mounting member when the fastening member is in the second state.

5. The bracket device of claim 1, wherein the elastic member is arranged between the sidewall and the fastening member.

6. The bracket device of claim 5, further comprising a blocking portion bent with respect to the sidewall, wherein the elastic member includes an elastic portion located between the blocking portion and the fastening member.

7. The bracket device of claim 1, wherein the fastening member is pivotally connected to the sidewall, the fastening member includes a lateral portion and a fastening portion bent with respect to the lateral portion, the engaging structure is located at the fastening portion, the engaging structure includes an extension arm and a hook portion bent with respect to the extension arm, and the fastening portion is adjacent to the at least one mounting member when the fastening member is in the first state.

8. The bracket device of claim 7, wherein the lateral portion and the fastening portion of the fastening member and the extension arm and the hook portion of the engaging structure are integrally formed.

9. The bracket device of claim 7, wherein the fastening portion has an upper side and a lower side, and the extension arm of the engaging structure is substantially perpendicularly connected between the upper side and the lower side.

10. A bracket device adapted to be mounted to a slide rail assembly which includes a first rail and a second rail displaceable with respect to each other, the bracket device comprising:
a sidewall mountable to the first rail of the slide rail assembly;
a base adjacent to the sidewall;
at least one mounting member connected to the base;
an elastic member; and
a fastening member movably mounted on the sidewall and extending longitudinally beyond the base therefrom, wherein the fastening member includes an engaging structure, and the fastening member stays in a predetermined state responsive to an elastic force provided by the elastic member;
wherein the engaging structure of the fastening member is retentively mountable by a target member projecting thereto from an object external to the bracket device.

11. The bracket device of claim 10, wherein the engaging structure includes a space and at least one blocking wall adjacent to the space.

12. The bracket device of claim 11, further comprising an end wall substantially perpendicularly connected to the sidewall, wherein the base is arranged on the end wall, and the at least one mounting member extends through the end wall.

13. The bracket device of claim 10, wherein the fastening member is pivotally connected to the sidewall, the fastening member includes a lateral portion and a fastening portion bent with respect to the lateral portion, the lateral portion includes the engaging structure, the fastening portion is adjacent to the at least one mounting member when the fastening member is in the predetermined state, and the fastening portion is away from the at least one mounting member when the fastening member is not in the predetermined state.

14. The bracket device of claim 10, further comprising a blocking portion bent with respect to the sidewall, wherein the elastic member includes an elastic portion located between the blocking portion and the fastening member.

15. The bracket device of claim 10, wherein the fastening member is pivotally connected to the sidewall, the fastening member includes a lateral portion and a fastening portion bent with respect to the lateral portion, the engaging structure is located at the fastening portion, the engaging structure includes an extension arm and a hook portion bent with respect to the extension arm, and the fastening portion is adjacent to the at least one mounting member when the fastening member is in the predetermined state.

16. The bracket device of claim 15, wherein the lateral portion and the fastening portion of the fastening member and the extension arm and the hook portion of the engaging structure are integrally formed.

17. The bracket device of claim 15, wherein the fastening portion has an upper side and a lower side, and the extension arm of the engaging structure is substantially perpendicularly connected between the upper side and the lower side.

18. A bracket device adapted for mounting a slide rail assembly, wherein the slide rail assembly includes a first rail mountable to a post of a rack via the bracket device and a second rail mountable with an object, the second rail is displaceable with respect to the first rail, and the post has a plurality of post holes, the bracket device comprising:
   a sidewall;
   a base adjacent to the sidewall;
   at least one mounting member connected to the base, wherein the at least one mounting member is configured to extend through one of the post holes of the post;
   an elastic member; and
   a fastening member movably mounted on the sidewall and extending longitudinally beyond the base therefrom, wherein the fastening member includes a fastening portion and an engaging structure, and the fastening member is configured to stay in a first state responsive to an elastic force provided by the elastic member, in order to lock the fastening portion to the post;
   wherein the fastening member is switchable from the first state to a second state by deflection of the elastic member;
   wherein when the second rail is at a retracted position with respect to the first rail and the fastening member is in the first state, the engaging structure of the fastening member is retentively engageable by an engaging member projecting thereto from the object.

19. The bracket device of claim 18, wherein the fastening member is pivotally connected to the sidewall, the fastening member includes a lateral portion, the fastening portion is bent with respect to the lateral portion, the lateral portion includes the engaging structure, and the engaging structure includes a space and at least one blocking wall adjacent to the space.

20. The bracket device of claim 18, wherein the fastening member is pivotally connected to the sidewall, the fastening member includes a lateral portion, the fastening portion is bent with respect to the lateral portion, the engaging structure is located at the fastening portion, the engaging structure includes an extension arm and a hook portion bent with respect to the extension arm, the lateral portion and the fastening portion of the fastening member and the extension arm and the hook portion of the engaging structure are integrally formed, and the extension arm of the engaging structure is substantially perpendicularly connected to the fastening portion.

* * * * *